(12) United States Patent
Kudo

(10) Patent No.: US 7,915,733 B2
(45) Date of Patent: Mar. 29, 2011

(54) SEMICONDUCTOR DEVICE

(75) Inventor: Hiroshi Kudo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 247 days.

(21) Appl. No.: 12/268,712

(22) Filed: Nov. 11, 2008

(65) Prior Publication Data

US 2009/0200676 A1 Aug. 13, 2009

(30) Foreign Application Priority Data

Feb. 7, 2008 (JP) ................. 2008-027977

(51) Int. Cl.
*H01L 23/48* (2006.01)
*H01L 23/52* (2006.01)
*H01L 29/40* (2006.01)

(52) U.S. Cl. ................. 257/758; 257/774; 257/E23.145

(58) Field of Classification Search .................. 257/211, 257/758, 774, E23.145
See application file for complete search history.

(56) References Cited

U.S. PATENT DOCUMENTS

| 6,989,583 B2 | 1/2006 | Fujii |
| 2005/0121788 A1* | 6/2005 | Watanabe et al. ............. 257/751 |

FOREIGN PATENT DOCUMENTS

| JP | 2004-207353 A | 7/2004 |
| JP | 2004-296644 A | 10/2004 |

OTHER PUBLICATIONS

T. Suzuki et al., "Stress migration phenomenon in narrow copper interconnects", Journal of Applied Physics, Feb. 15, 2007, vol. 101, No. 4, 044513.

* cited by examiner

*Primary Examiner* — Hoai V Pham
(74) *Attorney, Agent, or Firm* — Westerman, Hattori, Daniels & Adrian, LLP

(57) ABSTRACT

A semiconductor device which includes a first wiring with a via connected to the first wiring, a second wiring connected to the via and a dummy via disposed adjacent to the via at a distance of 100 nm or less and formed on the same layer as the via.

15 Claims, 20 Drawing Sheets

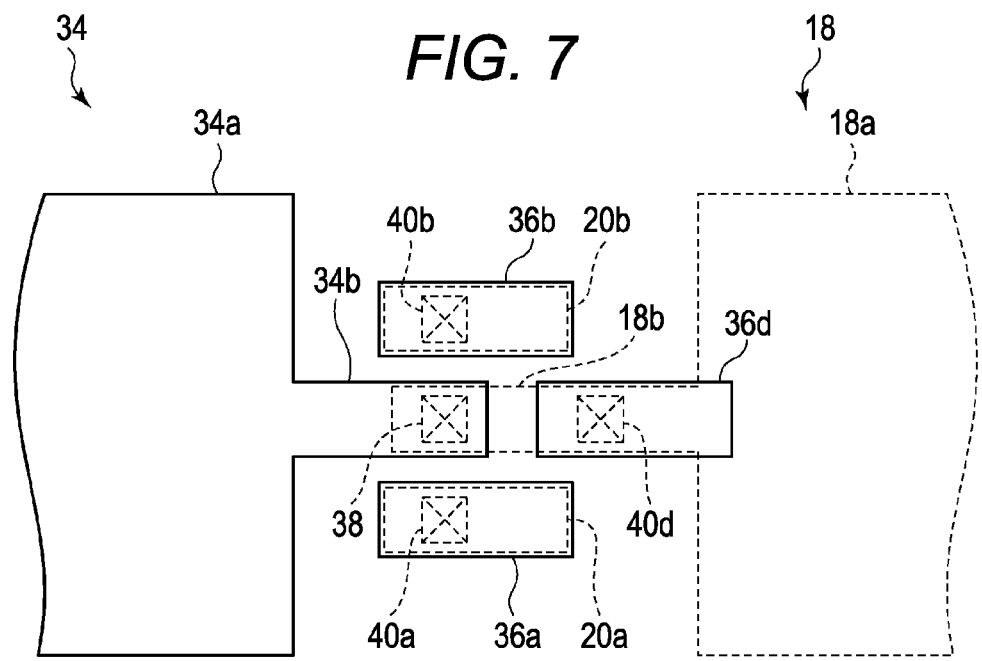
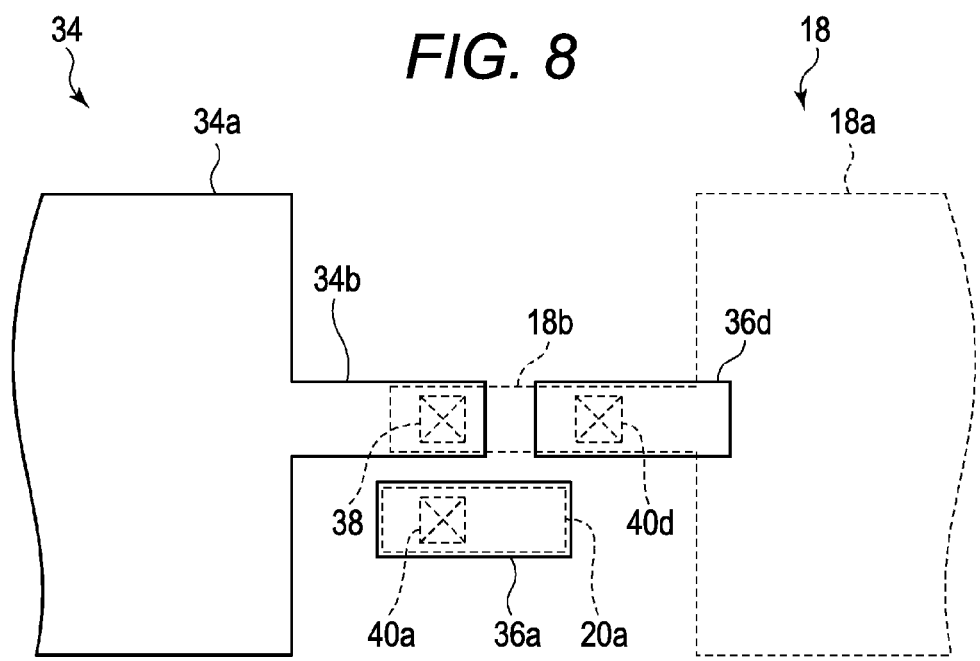

SEMICONDUCTOR DEVICE

CROSS-REFERENCE TO RELATED APPLICATIONS

This application is based upon and claims the benefit of priority of Japanese Patent Application No. 2008-27977, filed on Feb. 7, 2008, the entire contents of which are incorporated herein by reference.

FIELD

The embodiments discussed herein are directed to a semiconductor device having a wiring connected by a via.

BACKGROUND

As a wiring material for a semiconductor device, copper having a low resistance and a high electromigration resistance has been widely used instead of the conventional aluminum. In a multilayer wiring structure using copper as a wiring material, an upper layer wiring and a lower layer wiring are generally connected to each other by a via integrally formed in the upper layer wiring. Japanese Patent Laid-Open Publication No. 2004-207353 discloses such a connection structure.

In the above copper wiring, on the basis of the difference in thermal expansion coefficient between a copper film as a wiring and an interlayer insulating film in which a wiring is buried, the stress from the interlayer insulating film acts on the via. In addition, the stress from a wiring body also acts on the via. The larger the wiring width, the larger the stress acting on the via. The stress in the via is generated by the action of the stress from the interlayer insulating film. When the stress is generated in the via, copper atoms constituting the via are moved, whereby a void is generated in the bottom of the via. This phenomenon is widely known as stress migration, and contributes to the deterioration of the reliability of a wiring. Japanese Patent Laid-Open Publication No. 2004-296644 discloses the stress migration generated in a lower layer wiring.

FIG. 1 is a cross-sectional view showing a void generated in a via of a copper wiring.

An interlayer insulating film 102 is formed on a copper wiring 100 of a lower layer formed on a semiconductor substrate (not shown). A via hole 104 reaching the copper wiring 100 is formed in the interlayer insulating film 102.

The interlayer insulating film 102 has an upper layer copper wiring 106 formed thereon. The copper wiring 106 integrally has a via 108 buried in the via hole 104.

Copper atoms are moved by the stress in the via 108, whereby a void 110 is generated in the bottom of the via 108 as indicated by the dashed lines circle in the drawing.

Some copper wirings have a wide wiring part and a protruding wiring part, which has a smaller width than the wide wiring part and protrudes from the end of the wide wiring part along the extending direction of the wide wiring part.

FIG. 2 is a plan view showing a copper wiring having the above-mentioned protruding wiring part.

As illustrated, an upper layer copper wiring 112 has a wide wiring part 112a and a protruding wiring part 112b, which has a smaller width than the wide wiring part 112a and protrudes from the end of the wide wiring part 112a along the extending direction of the wide wiring-part 112a.

A via 114 buried in an interlayer insulating film (not shown) under the copper wiring 112 is integrally formed at the end of the protruding wiring part 112b. The upper layer copper wiring 112 is connected to a lower layer copper wiring 116 through the via 114.

The "Stress migration phenomenon in narrow copper interconnects" (T. Suzuki et al., Journal of Applied Physics, Volume 101, U.S. Pat. No. 4,044,513, Feb. 15, 2007) discloses the stress generated in a via formed in a protruding wiring part.

However, in the related art, it has been difficult to reduce the failure, which is caused by stress migration and occurring in a via formed in a protruding wiring part. It has been found that in the protruding wiring part, the stress from the wide wiring part is concentrated on the via, whereby the stress migration easily occurs.

SUMMARY

According to an aspect of an embodiment, a semiconductor device includes: a first wiring; a via connected to the first wiring; a second wiring connected to the via; and a dummy via disposed adjacent to the via at a distance of 100 nm or less and formed on the same layer as the via.

According to an aspect of an embodiment, a semiconductor device includes: a first wiring having a first wide wiring part and a first protruding wiring part having a smaller width than the first wide wiring part and protruding from the first wide wiring part; a second wiring formed on a layer different from a layer of the first wiring and having a second wide wiring part and a second protruding wiring part having a smaller width than the second wide wiring part and protruding from the second wide wiring part; a via electrically connecting the first protruding wiring part to the second protruding wiring part; a first dummy via formed on the same layer as the via and electrically connected to the first protruding wiring part; and a second dummy via formed on the same layer as the via and electrically connected to the second protruding wiring part.

BRIEF DESCRIPTION OF DRAWINGS

FIG. 7 is a plan view showing a structure of a semiconductor device according to an example 2 in the first embodiment;

FIG. 8 is a plan view showing a structure of a semiconductor device according to an example 3 in the first embodiment;

DESCRIPTION OF EMBODIMENTS

First Embodiment

Figure 1:
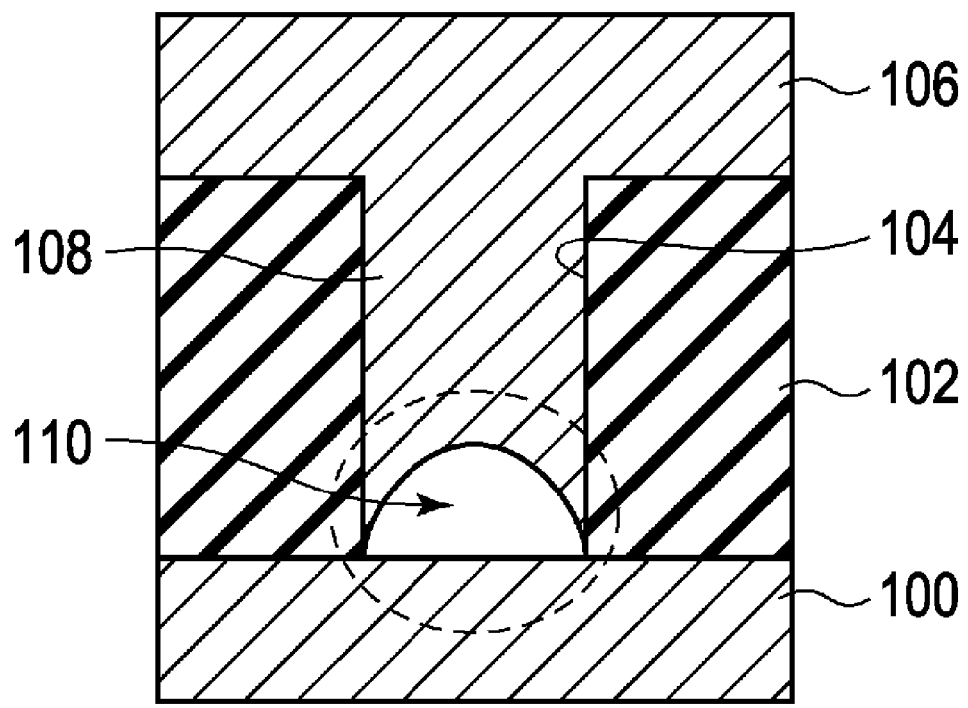
FIG. 1 is a cross-sectional view showing a void generated in a via of a copper wiring.
Figure 2:
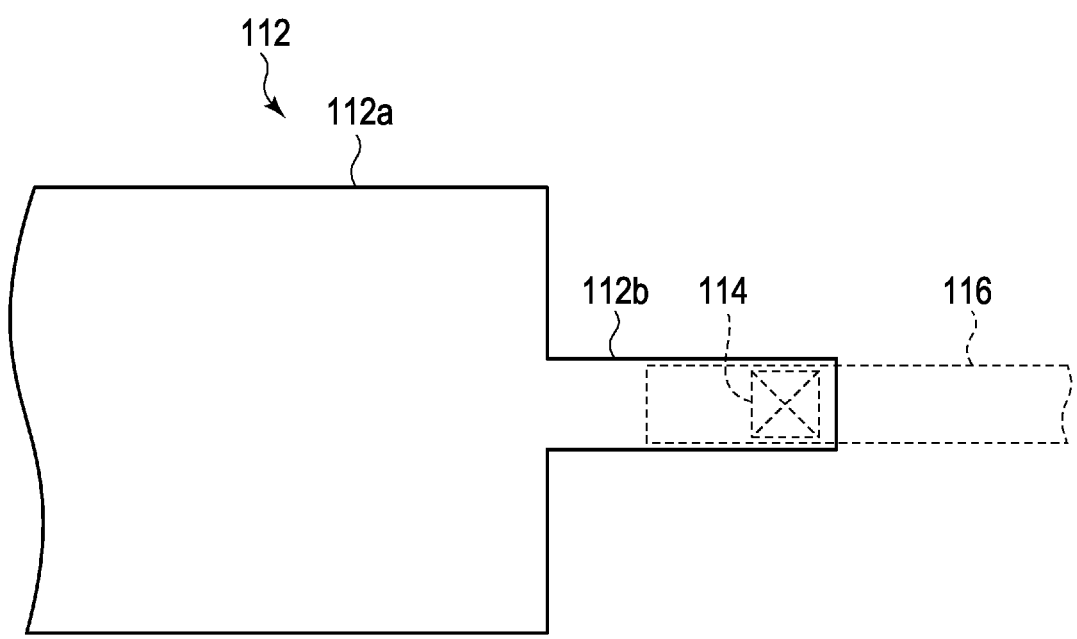
FIG. 2 is a plan view showing a copper wiring having a protruding wiring part.
Figure 3A:
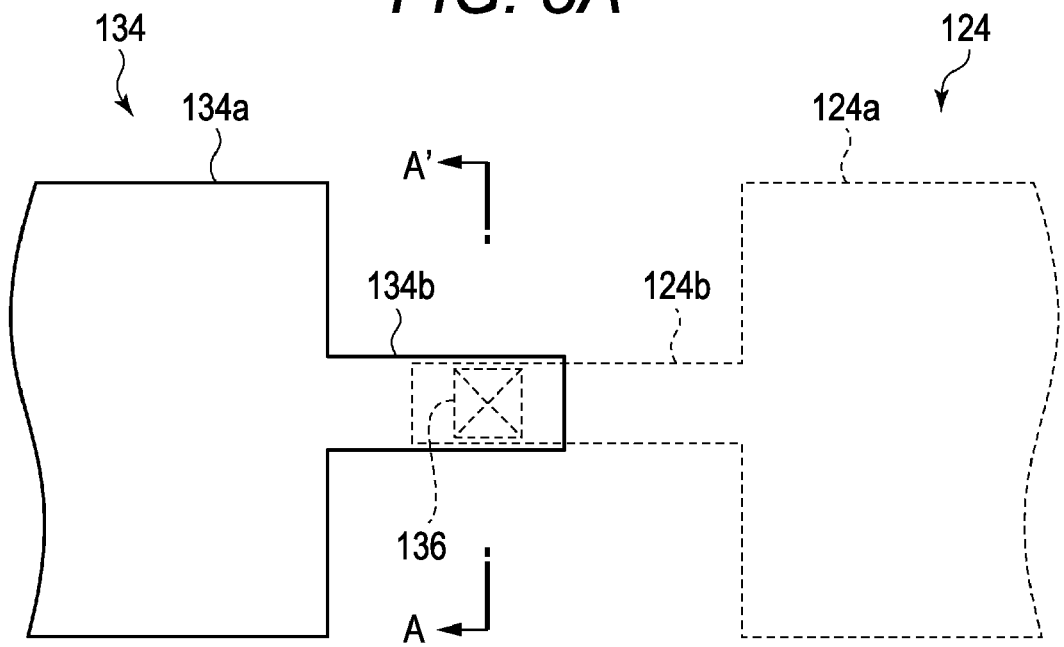
FIGS. 3A and 3B are schematic views showing a wiring structure in which an average stress in a via is calculated by simulation.
Figure 3B:
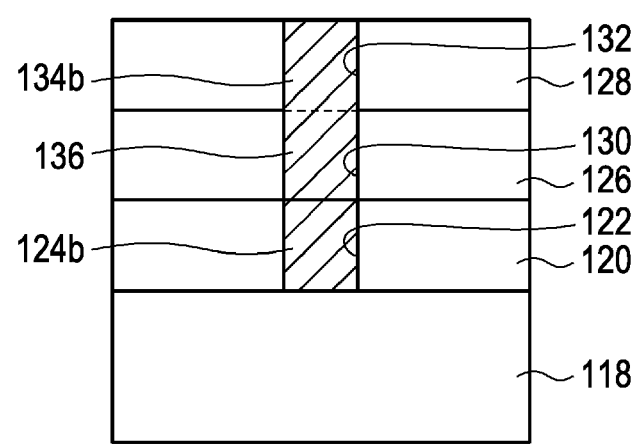
Figure 4:
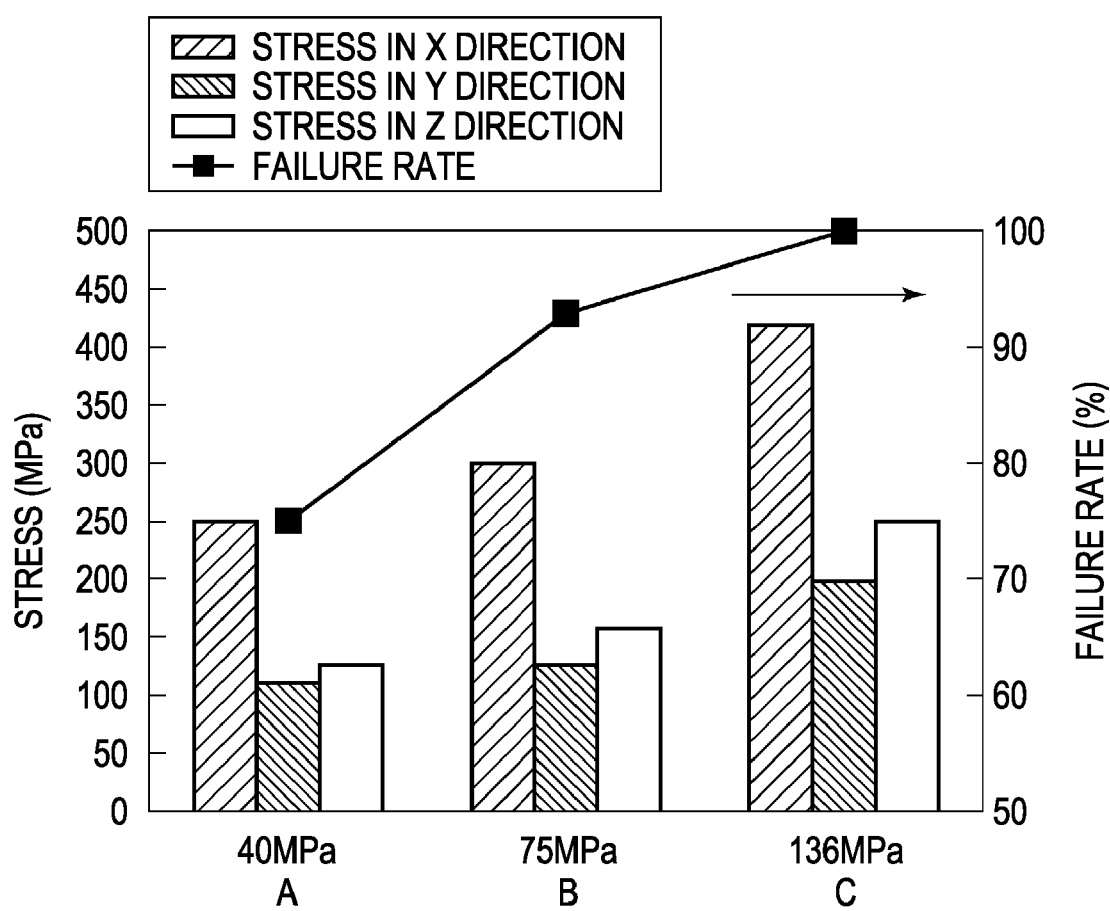
FIG. 4 is a graph showing a relation between an average stress in the via formed in the protruding wiring part and a failure rate.

First, as a concept of a first embodiment, the relation between an average stress in a via formed in a protruding wiring part protruding from a wide wiring part of a copper wiring and a failure rate is described using FIGS. 3 and 4.

The present inventor has calculated by simulation for the average stress in the via formed in the protruding wiring part protruding from the wide wiring part.

The wiring structure in which the simulation has been performed is described using FIG. 3. FIG. 3A is a plan view showing the wiring structure in which the simulation has been performed. FIG. 3B is a cross-sectional view of an A-A' line of FIG. 3A.

As illustrated, an interlayer insulating film 120 is formed on a silicon substrate 118. A wiring groove 122 is formed in the interlayer insulating film 120.

A lower layer first wiring 124 is buried in the wiring groove 122. As shown in FIG. 3A, the first wiring 124 has a wide wiring part 124a and a protruding wiring part 124b which has a smaller width than the wide wiring part 124a and protrudes from the end of the wide wiring part 124a along the extending direction (lateral direction on the drawing) of the wide wiring part 124a.

An interlayer insulating film 126 is formed on the interlayer insulating film 120. An interlayer insulating film 128 is formed on the interlayer insulating film 126. A via hole 130 reaching the protruding wiring part 124b of the first wiring 124 is formed in the interlayer insulating film 126. A wiring groove 132 connected to the via hole 130 is formed in the interlayer insulating film 128.

An upper layer second wiring 134 is buried in the wiring groove 132. As shown in FIG. 3A, the second wiring 134 has a wide wiring part 134a and a protruding wiring part 134b which has a smaller width than the wide wiring part 134a and protrudes from the end of the wide wiring part 134a along the extending direction (lateral direction on the drawing) of the wide wiring part 134a. The second wiring 134 further has at the end of the protruding wiring part 134b a via 136 buried in the via hole 130. The via 136 is integrally formed in the protruding wiring part 134b.

The end on the side of the protruding wiring part 134b of the second wiring 134 and the end on the side of the protruding wiring part 124b of the first wiring 124 are opposed to each other, and the end of the protruding wiring part 134b and the end of the protruding wiring part 124b are overlapped with each other. The via 136 connects the protruding wiring part 134b of the second wiring 134 to the protruding wiring part 124b of the first wiring 124.

In the simulation, three types of insulating films "A", "B", and "C" each of which has different film stress are used as the interlayer insulating film 126 with the via 136 buried therein. When the stress generated in the via 136 is calculated for each of the insulating films "A", "B", and "C", the film stress of the insulating films "A", "B", and "C" are respectively 40 MPa, 75 MPa, and 136 MP. When the longitudinal direction of the protruding wiring parts 124b and 134b is X direction, the width direction is Y direction, and a direction perpendicular to a substrate surface is Z direction, each average stress in the via 136 in the X, Y, and Z directions is calculated.

In FIG. 4, the simulation calculation result of the average stress in the via 136 is shown with bar graphs. As seen in the result shown in FIG. 4, the stress in the Z direction is particularly substantially different in each film stress of the interlayer insulating film 126 with the via 136 buried therein. It is considered that the stress in the Z direction mainly causes stress migration. It may be considered that each stress in the X and Y directions affects stress migration; however, it is considered that the influence of the stress in the X and Y directions is smaller than the influence of the stress in the Z direction.

The present inventor has provided a wiring structure having a via formed in a protruding wiring part and has conducted a stress migration test. FIG. 4 shows the result of the stress migration test with line graphs. In the stress migration test, the provided wiring structure has been subjected to the heat treatment at 200° C. for 500 hours, and the wiring structure with the resistance value after the heat treatment of 50% higher than the initial value before the heat treatment has been counted as a failure.

When the stress calculation result and the result of the stress migration test shown in FIG. 4 are compared with each other, it is found that the failure rate increases with increased stress in the via.

In general, an SiOC film, an SiC film, and a silicon oxide film formed by a plasma CVD method are used as the interlayer insulating film with a via of a wiring buried therein. An SiOC film formed by a spin coat method is also used. These insulating films have a large film stress, whereby they contribute to the occurrence of a large stress in a via.

Meanwhile, in a wiring formation process, it is necessary to protect a wiring from being broken in a CMP process and the like in which a large pressure is applied to the wiring. The above interlayer insulating films have a large mechanical strength and serve a function of protecting the wiring from being broken in the CMP process and the like. In general, there is a correlation between the film stress of an insulating film and the mechanical strength, whereby an insulating film with an increased mechanical strength increases the film stress.

Therefore, when an insulating film having a small film stress is used as the interlayer insulating film with a via buried therein, it is possible to reduce the stress in a via which causes stress migration resulting in the increased failure rate; however, the mechanical strength of the interlayer insulating film is also reduced. Thus, in this case, it is difficult to choose an insulating film which reduces stress migration because a high strength interlayer insulating film serves a function of protecting a wiring from being broken in the CMP process and the like.

In the first embodiment, a dummy via is disposed adjacent to the via formed in the protruding wiring part protruding from the wide wiring part which is an actual wiring, whereby the stress from the interlayer insulating film with the via buried therein acting on the via of the protruding wiring part is moderated. In addition, the stress from the wide wiring part acting on the via of the protruding wiring part is moderated. According to this constitution, the stress generated in the via formed in the protruding wiring part is reduced, whereby the stress migration resistance is improved. In this embodiment, the via connects between a first wiring and a second wiring formed on a layer different from the first wiring and is a current pathway from the first wiring to the second wiring. Meanwhile, the dummy via is not connected to any of the first and second wirings and is in a floating state in terms of potential, or the dummy via is connected to any one of the first and second wirings, and although the dummy via is not in the floating state in terms of potential, it is not used as the current pathway from the first wiring to the second wiring.

Example 1

Figure 5:
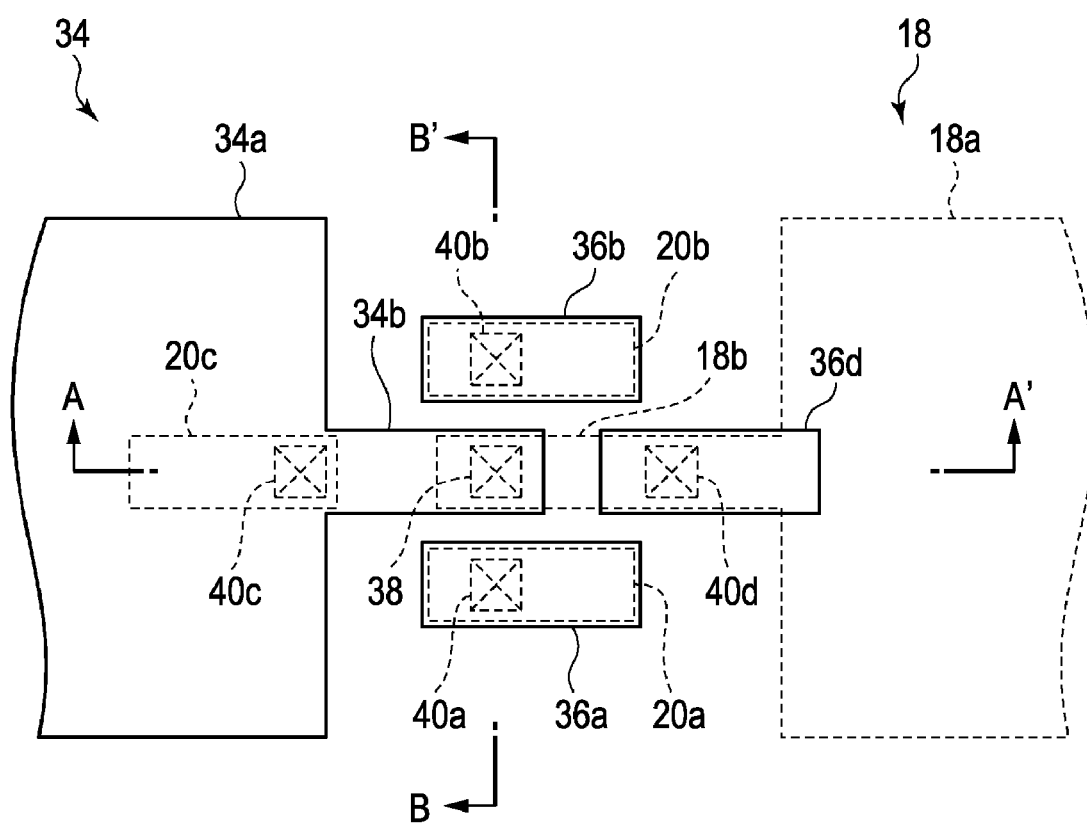
FIG. 5 is a plan view showing a structure of a semiconductor device according an example 1 in a first embodiment.
Figure 6A:
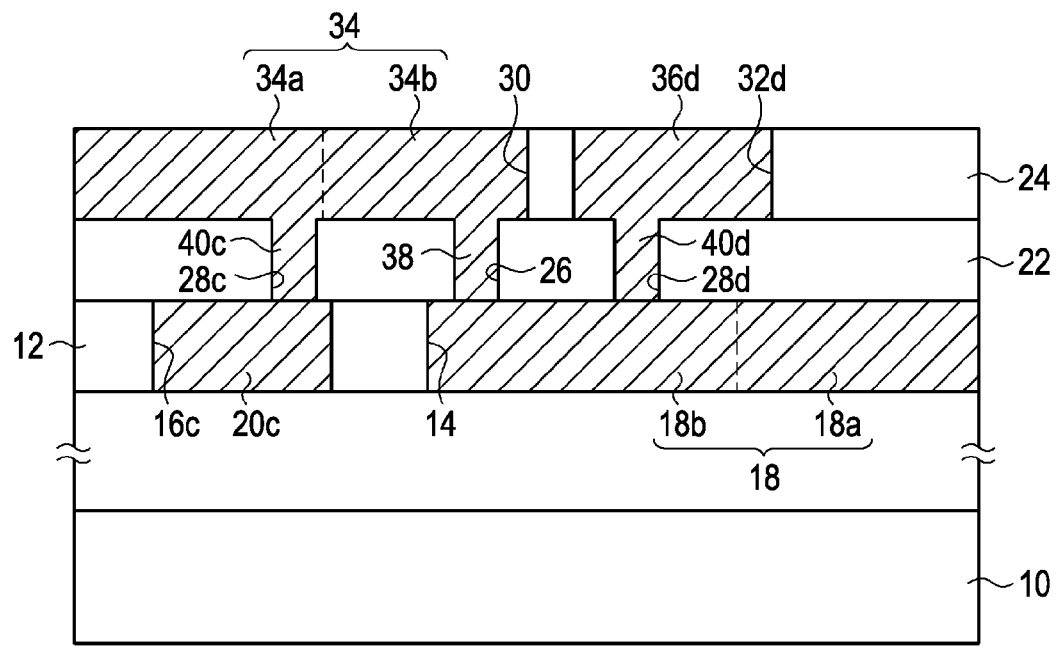
FIGS. 6A and 6B are cross-sectional views showing the structure of the semiconductor device according to the example 1 in the first embodiment.
Figure 6B:
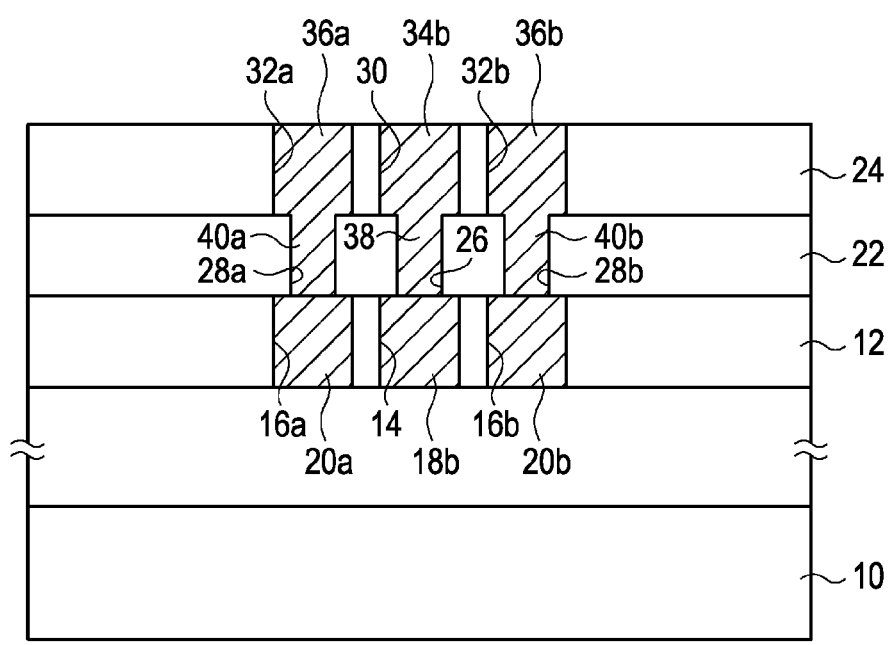

Next, a semiconductor device according to an example 1 in a first embodiment is described using FIGS. 5 and 6. FIG. 5 is a plan view showing a structure of a semiconductor device according the example 1. FIG. 6A is cross-sectional view of the A-A' line of FIG. 5. FIG. 6B is a cross-sectional view of the B-B' line from FIG. 5.

An interlayer insulating film 12 is formed on a semiconductor substrate 10. A wiring groove 14 for burying an actual wiring therein and wiring grooves 16a, 16b, and 16c for burying a dummy wiring therein are formed in the interlayer insulating film 12. Incidentally, elements such as a transistor and a wiring (not shown) are formed on the semiconductor substrate.

A first wiring 18 which is an actual wiring is buried in the wiring groove 14. Meanwhile, dummy wirings 20a, 20b, and 20c are respectively buried in the wiring grooves 16a, 16b, and 16c. These dummy wirings 20a, 20b, and 20c are formed on the same layer as the first wiring 18. The first wiring 18 and the dummy wirings 20a, 20b, and 20c are formed of a wiring material containing copper. In this specification, this wiring material containing copper includes a wiring material containing other element such as aluminum and silicon in addition to copper.

As shown in FIG. 5, the first wiring 18 has a wide wiring part 18a and a protruding wiring part 18b having a smaller width than the wide wiring part 18a and protruding from the end of the wide wiring part 18a along the extending direction (lateral direction on the drawing) of the wide wiring part 18a.

An interlayer insulating film 22 is formed on the interlayer insulating film 12 with the first wiring 18 and the dummy wirings 20a, 20b, and 20c buried therein. An interlayer insulating film 24 is formed on the interlayer insulating film 22.

A via hole 26 reaching the protruding wiring part 18b of the first wiring 18 is formed in the interlayer insulating film 22. In addition, via holes 28a, 28b, and 28c respectively reaching the dummy wirings 20a, 20b, and 20c are formed in the interlayer insulating film 22. Further, a via hole 28d reaching a part closer to the wide wiring part 18a than the via hole 26 of the protruding wiring part 18b is formed in the interlayer insulating film 22.

A wiring groove 30 connected to the via hole 26 reaching the protruding wiring part 18b and the via hole 28c reaching the dummy wiring 20c and burying an actual wiring therein is formed in the interlayer insulating film 24. In addition, wiring grooves 32a and 32b which are respectively connected to the via holes 28a and 28b reaching the dummy wirings 20a and 20b and buries a dummy wiring therein are formed in the interlayer insulating film 24. Further, a wiring groove 32d which is connected to the via hole 28d reaching the protruding wiring part 18b and buries a dummy wiring therein is formed in the interlayer insulating film 24.

A second wiring 34 which is an actual wiring is buried in the wiring groove 30. Meanwhile, dummy wirings 36a, 36b, and 36d are respectively buried in the wiring grooves 32a, 32b, and 32d. The second wiring 34 and the dummy wirings 36a, 36b, and 36d are formed of a wiring material containing copper.

As shown in FIG. 5, the second wiring 34 has a wide wiring part 34a and a protruding wiring part 34b having a smaller width than the wide wiring part 34a and protruding from the end of the wide wiring part 34a along the extending direction (lateral direction on the drawing) of the wide wiring part 34a. The second wiring 34 further integrally has at the end of the protruding wiring part 34b a via 38 buried in the via hole 26. The via 38 is connected to the protruding wiring part 18b of the first wiring 18. The second wiring 34 is thus connected to the first wiring 18 through the via 38.

The dummy wirings 36a and 36b respectively integrally have dummy vias 40a and 40b respectively buried in the via holes 28a and 28b. The dummy vias 40a and 40b are respectively connected to the dummy wirings 20a and 20b.

The second wiring 34 integrally has a dummy via 40c, buried in the via hole 28c, near the part where the protruding wiring part 34b protrudes from the wide wiring part 34a. The dummy via 40c is connected to the dummy wiring 20c.

The dummy wiring 36d integrally has a dummy via 40d buried in the via hole 28d. The dummy via 40d is connected to the protruding wiring part 18b of the first wiring 18.

The dummy wirings 36a, 36b and 36d are thus formed on the same layer as the second wiring 34. The dummy vias 40a, 40b, 40c, and 40d are formed on the same layer as the via 38.

A wiring structure (not shown) corresponding to the design of the semiconductor device is formed on the interlayer insulating film 24 with the second wiring 34 and the dummy wirings 36a, 36b, and 36d buried therein.

As shown in FIG. 5, the first wiring 18 and the second wiring 34 are formed to extend along the same direction. The side end of the protruding wiring part 18b of the first wiring 18 and the side end of the protruding wiring part 34b of the second wiring 34 are opposed to each other, and the ends of the protruding wiring parts 18b and 34b are overlapped with each other. The via 38 of the second wiring 34 is formed in the area where the ends of the protruding wiring parts 18b and 34b are overlapped with each other. The via 38 is connected to the protruding wiring part 18b of the first wiring 18.

The dummy wiring 20a, the dummy wiring 36a, and the dummy via 40a are formed on one side of the via 38 in a direction along the width direction of the protruding wiring part 34b, that is, the second wiring 34, and, at the same time, they are formed on the inside of the width of the wide wiring part 34a. The dummy via 40a is disposed at a position on a line (B-B' line) passing through the via 38 and extending along the width direction of the second wiring 34.

The dummy wiring 20b, the dummy wiring 36b, and the dummy via 40b are formed on another side of the via 38 in a direction along the width direction of the protruding wiring part 34b, that is, the second wiring 34, and, at the same time, they are formed on the inside of the width of the wide wiring part 34a. The dummy via 40b is disposed at a position on a line (B-B' line) passing through the via 38 and extending along the width direction of the second wiring 34.

The dummy wiring 20c and the dummy via 40c are formed on the second wiring 34 side of the via 38 in a direction along the protruding direction of the protruding wiring part 34b, that is, a direction along the extending direction of the second wiring 34. The dummy via 40c is disposed at a position on a line (A-A' line) passing through the via 38 and extending along the extending direction of the second wiring 34.

The dummy wiring 36d and the dummy via 40d are formed on the first wiring 18 side of the via 38 in a direction along the protruding direction of the protruding wiring part 34b, that is, a direction along the extending direction of the second wiring 34. The dummy via 40d is disposed at a position on a line (A-A' line) passing through the via 38 and extending along the extending direction of the second wiring 34.

According to the above constitution, the dummy vias 40a, 40b, 40c, and 40d are disposed around the via 38, which is integrally formed in the protruding wiring part 34b and connects the second wiring 34 to the first wiring 18, so as to be adjacent to the via 38.

In the semiconductor device according to the example 1, the dummy vias 40a, 40b, 40c, and 40d are disposed around the via 38, which is integrally formed in the protruding wiring part 34b of the second wiring 34 and connects the second wiring 34 to the first wiring 18, so as to be adjacent to the via 38.

In the semiconductor device according to the example 1, the dummy vias 40a, 40b, 40c, and 40d disposed adjacent to the via 38 moderate the stress from the interlayer insulating film 22, in which the via 38 is buried, acting on the via 38. In addition, the dummy vias 40a, 40b, 40c, and 40d moderate the stress from the wide wiring part 34a of the second wiring 34 acting on the via 38 through the protruding wiring part 34b. According to this constitution, the stress generated in the via 38 can be reduced. Thus, according to the example 1, the stress migration resistance of the via 38 formed in the protruding wiring part 34b of the second wiring 34 can be improved. In the example 1, the distance between a via and a dummy via is 70 nm. The distance between the via and the dummy via is preferably not more than 100 nm for the purpose of moderating the stress acting on the via. In view of the resolution performance of a photolithography technique and the parasitic capacitance generated between the via and the dummy via, the distance between the via and the dummy via is preferably not less than 50 nm.

Example 2

A semiconductor device according to an example 2 in the first embodiment is described using FIG. 7. FIG. 7 is a plan view showing a structure of the semiconductor device according to the example 2.

In the semiconductor device according to the example 2, only the three dummy vias 40a, 40b, and 40d from among the dummy vias 40a, 40b, 40c, and 40d are disposed without disposing the dummy via 40c.

As shown in FIG. 7, while the dummy vias 40a, 40b, and 40d are disposed in a similar manner to the case shown in FIG. 5, the dummy via 40c is not disposed. In accordance with such a constitution, the dummy wiring 20c to which the dummy via 40c is connected is not disposed.

The three dummy vias 40a, 40b, and 40d may be disposed adjacent to the via 38 formed in the protruding wiring part 34b as this embodiment.

Example 3

A semiconductor device according to an example 3 in the first embodiment is described using FIG. 8. FIG. 8 is a plan view showing a structure of the semiconductor device according to the example 3.

In the semiconductor device according to the example 3, only the two dummy vias 40a and 40d from among the dummy vias 40a, 40b, 40c, and 40d are disposed without disposing the dummy vias 40b and 40c.

As shown in FIG. 8, while the dummy vias 40a and 40d are disposed in a similar manner to the case shown in FIG. 5, the dummy vias 40b and 40c are not disposed. In accordance with such a constitution, the dummy wiring 36b in which the dummy via 40b is integrally formed, the dummy wiring 20b to which the dummy via 40b is connected, and the dummy wiring 20c to which the dummy via 40c is connected are not disposed.

The two dummy vias 40a and 40d may be disposed adjacent to the via 38 formed in the protruding wiring part 34b as this embodiment.

Example 4

Figure 9:
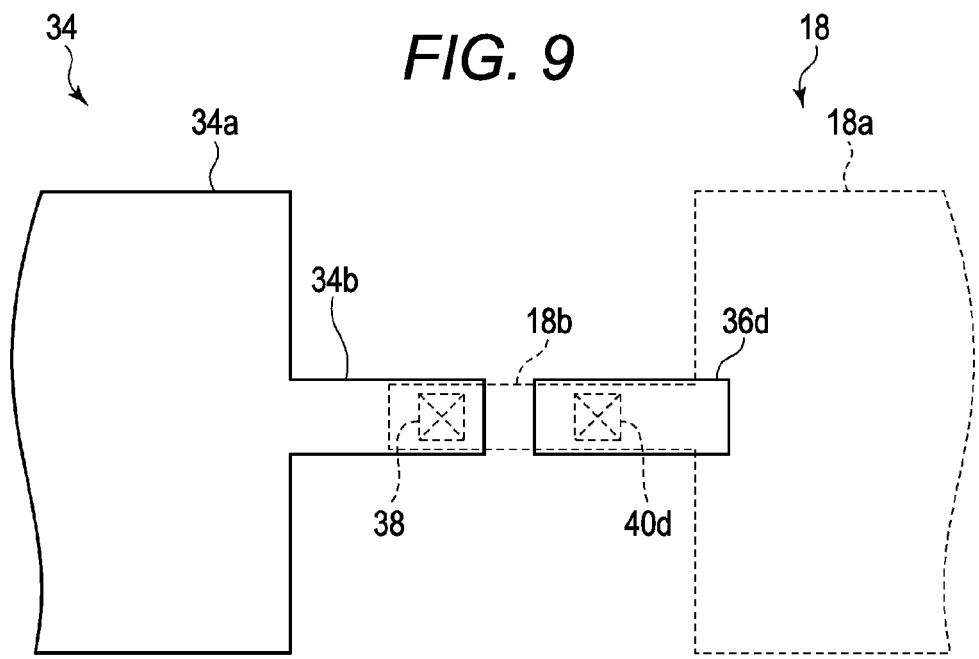
FIG. 9 is a plan view showing a structure of a semiconductor device according to an example 4 in the first embodiment.

A semiconductor device according to an example 4 in the first embodiment is described using FIG. 9. FIG. 9 is a plan view showing a structure of the semiconductor device according to the example 4.

In the semiconductor device according to the example 4, only the one dummy via 40d from among the dummy vias 40a, 40b, 40c, and 40d is disposed without disposing the dummy vias 40a, 40b and 40c.

As shown in FIG. 9, while the dummy via 40d is disposed in a similar manner to the case shown in FIG. 5, the dummy vias 40a, 40b and 40c are not disposed. In accordance with such a constitution, the dummy wiring 36a in which the dummy via 40a is integrally formed, the dummy wiring 20a to which the dummy via 40a is connected, the dummy wiring 36b in which the dummy via 40b is integrally formed, the dummy wiring 20b to which the dummy via 40b is connected, and the dummy wiring 20c to which the dummy via 40c is connected are not formed.

The one dummy via 40d may be disposed adjacent to the via 38 formed in the protruding wiring part 34b as this embodiment.

Embodiment 5

Figure 10:
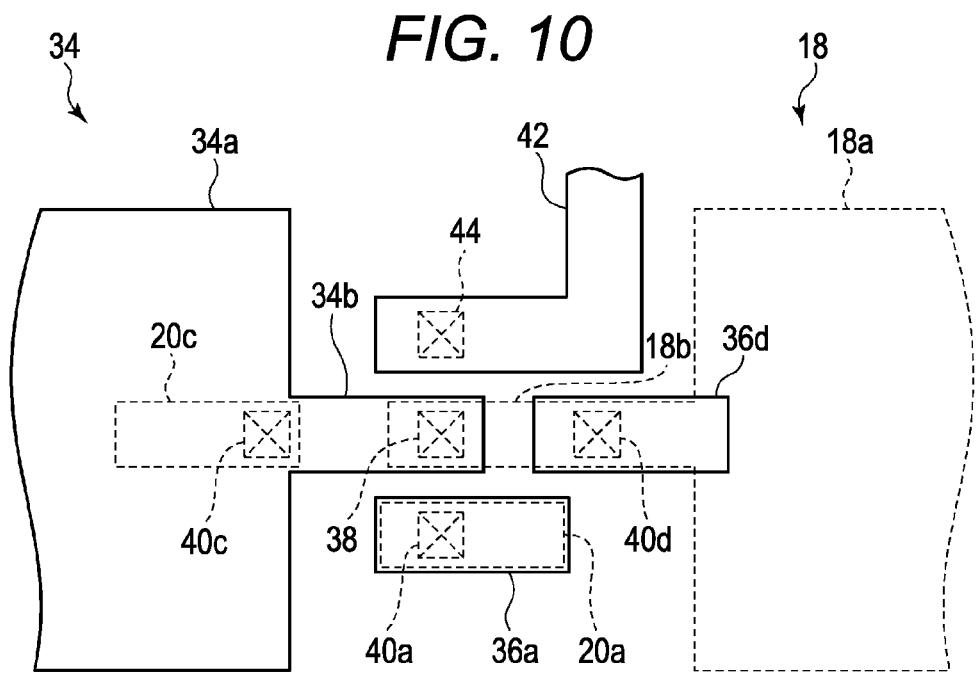
FIG. 10 is a plan view showing a structure of a semiconductor device according to an example 5 in the first embodiment.

A semiconductor device according to an example 5 in the first embodiment is described using FIG. 10. FIG. 10 is a plan view showing a structure of the semiconductor device according to the example 5.

In the semiconductor device according to the example 5, a dummy via is disposed adjacent to the via 38 in accordance with the layout of an actual wiring when a third wiring 42 which is an actual wiring different from the second wiring 34 is formed on the same layer as the second wiring 34 which is an actual wiring.

As shown in FIG. 10, the third wiring 42 which is other actual wiring is formed on the same layer as the second wiring 34 in an area including an area where the dummy wiring 36b shown in FIG. 5 is formed. The third wiring 42 integrally has a via 44 and is connected to an actual wiring (not shown) on a lower layer through the via 44. The via 44 of the third wiring 42 is located adjacent to the via 38 of the second wiring 34.

Since the third wiring 42 and the via 44 are formed, the dummy wiring 36b and the dummy via 40b are not disposed. On the other hand, the dummy vias 40a, 40c, and 40d are disposed in a similar manner to the case shown in FIG. 5.

With respect to the via 38 formed in the protruding wiring part 34b, the dummy vias 40a, 40c, and 40d are disposed in an empty area avoiding the area in which the third wiring 42 is formed.

When other actual wiring is formed on the same layer as the second wiring 34, the dummy via may be disposed with respect to the via 38 formed in the protruding wiring part 34b in accordance with the layout of the actual wiring.

(Evaluation Result)

Figure 11:
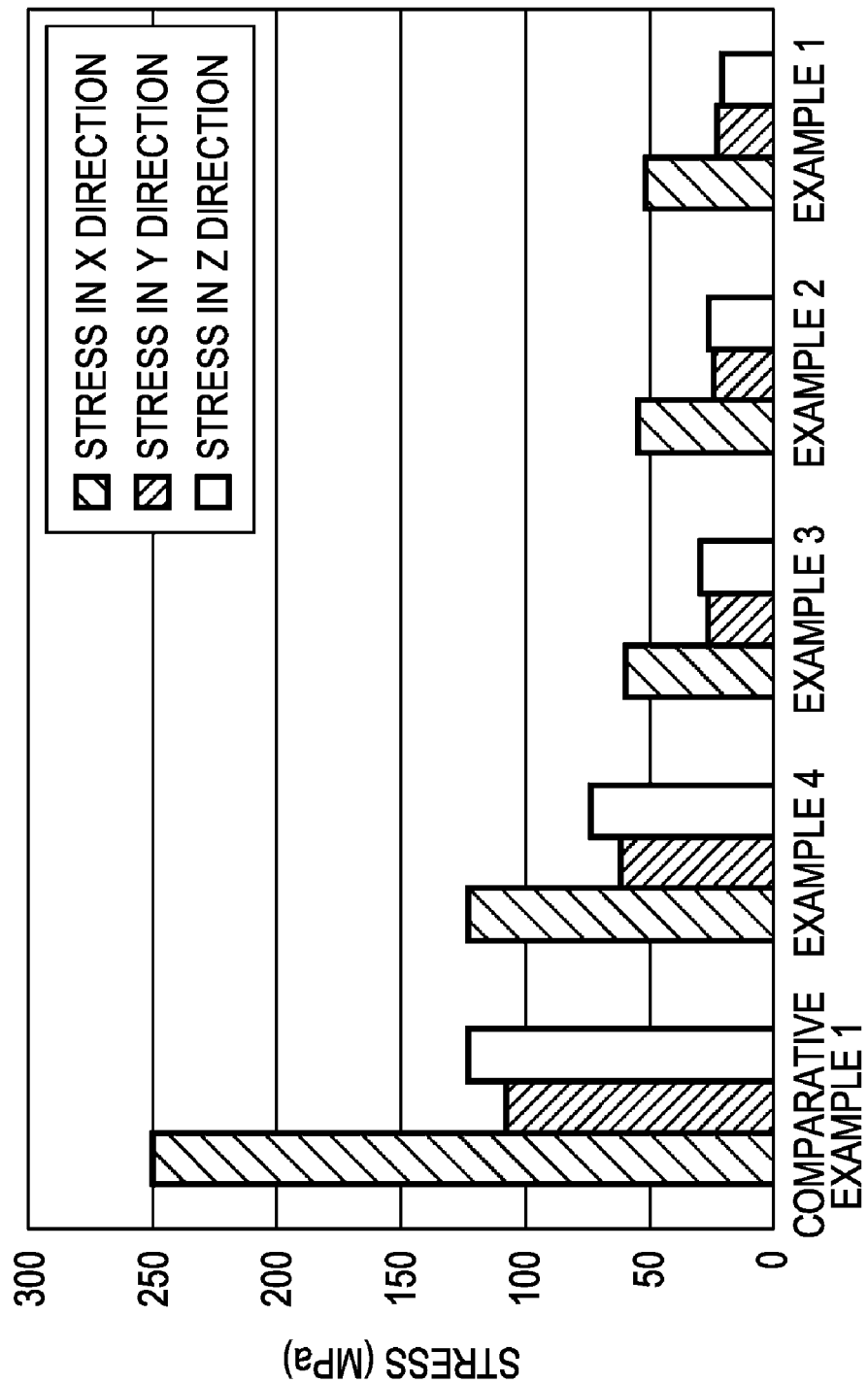
FIG. 11 is a graph showing an evaluation result of the semiconductor devices according to examples 1 to 4 in the first embodiment.

The evaluation result of the semiconductor device according to the first embodiment is described using FIG. 11.

In the examples 1 to 4 and a comparison 1, the average stress in the via 38 is calculated by simulation, and the reduction of the stress in the via 38 by a dummy via disposed adjacent to the via 38 is evaluated.

In the example 1, the four dummy vias 40a, 40b, 40c, and 40d are disposed (see, FIG. 5).

In the example 2, the three dummy vias 40a, 40b, and 40d are disposed (see, FIG. 7).

In the example 3, the two dummy vias 40a and 40d are disposed (see, FIG. 8).

In the example 4, the one dummy via 40d is disposed (see, FIG. 9).

In the comparison 1, none of the four dummy vias 40a, 40b, 40c, and 40d are disposed.

In the simulation, as with the case shown in FIG. 4, each average stress in the via 38 is calculated with respect to the X, Y, and Z directions. The interlayer insulating film 22 with the via 38 buried therein is set to be an insulating film "C" having a film stress of 136 MPa.

In FIG. 11, the simulation calculation result of the average stress in the via 38 is shown with bar graphs. As seen in the result shown in FIG. 11, it is found that, in comparison with the comparative example 1 in which no dummy vias are disposed around the via 38, the stress in the via 38 is reduced in all the examples 1 to 4 comprising a dummy via disposed adjacent to the via 38. In the examples 1 to 4, the stress in the via 38 is reduced by increasing the number of dummy vias disposed around the via 38.

According to the first embodiment, the stress in the via 38 formed in the protruding wiring part 34b is satisfactorily reduced, and the stress migration resistance of the via 38 can be improved.

Particularly, the above experimental result shows that the stress migration resistance is satisfactorily improved by disposing two or more dummy vias.

In FIG. 5, the two dummy vias 40c and 40d are respectively connected to the wiring parts 34a and 18a and have the same potential as the via 38 and the wirings 18 and 34. Meanwhile, the two dummy vias 40a and 40b are not connected to any of the wiring parts 18a and 34a and are in a floating state in terms of electricity. When the dummy vias 40a and 40b in the floating state in terms of electricity are formed adjacent to the via 38, the parasitic capacitance of the via 38 is increased, whereby the transmission rate is decreased. Thus, in order to keep the wiring delay to a minimum while improving the stress migration resistance, it is preferable to dispose (put) the dummy vias 40c and 40d which are not in the floating state in terms of electricity and are connected to a wiring.

Second Embodiment

Figure 12:
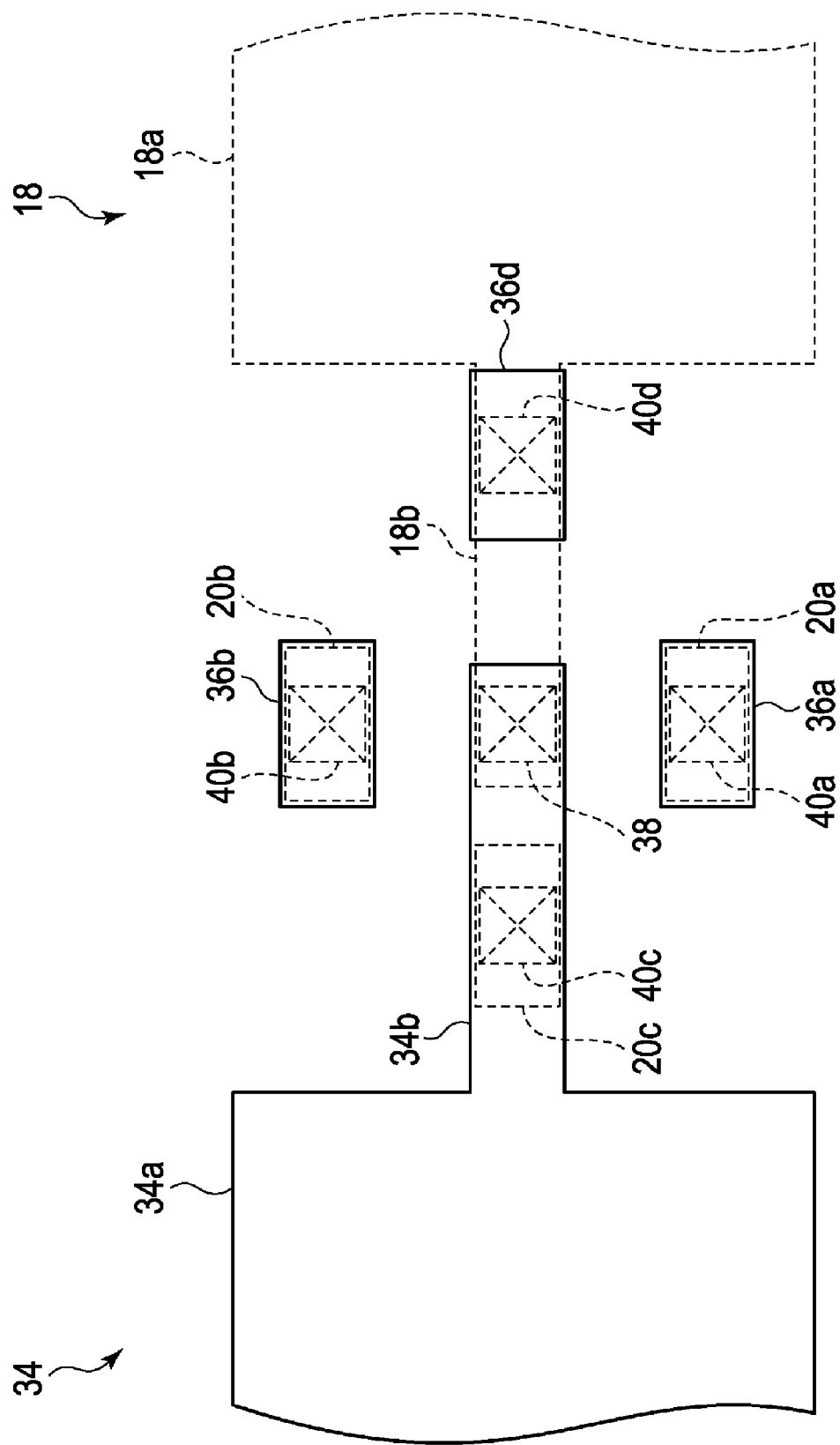
FIG. 12 is a plan view showing a structure of a semiconductor device according to a second embodiment.
Figure 19A:
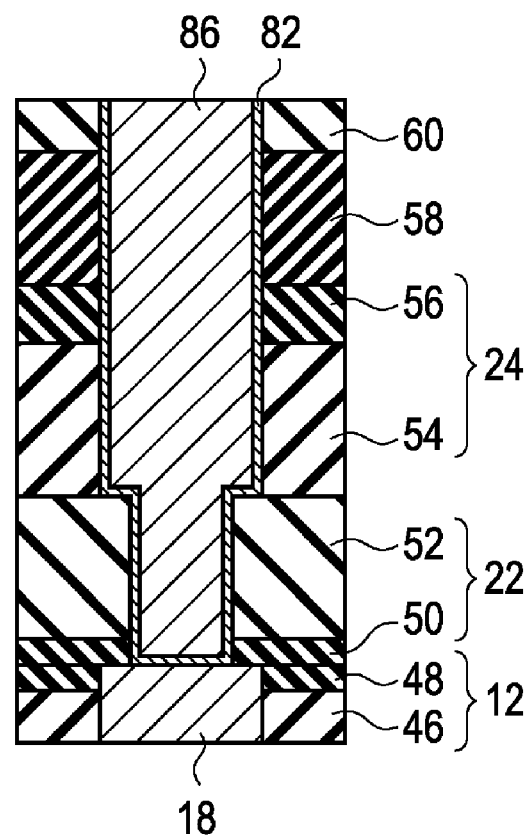
FIGS. 19A and 19B are cross-sectional views showing the method for manufacturing the semiconductor device according to the second embodiment.
Figure 19B:
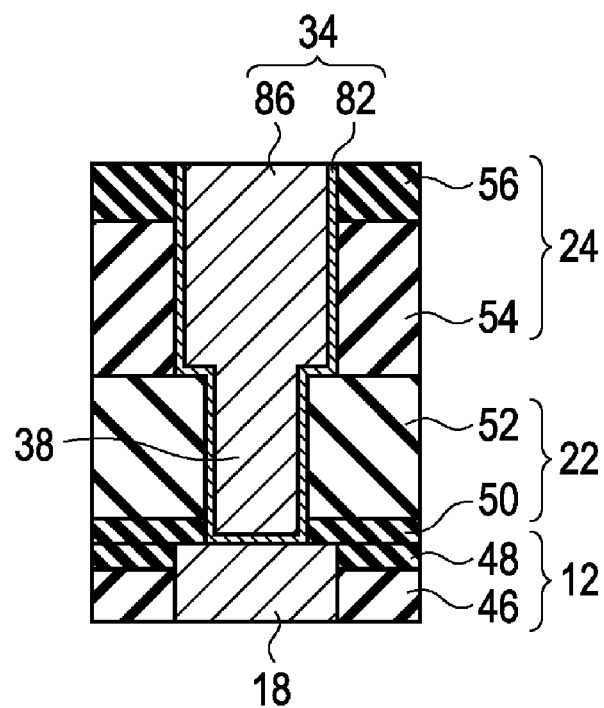
Figure 20:
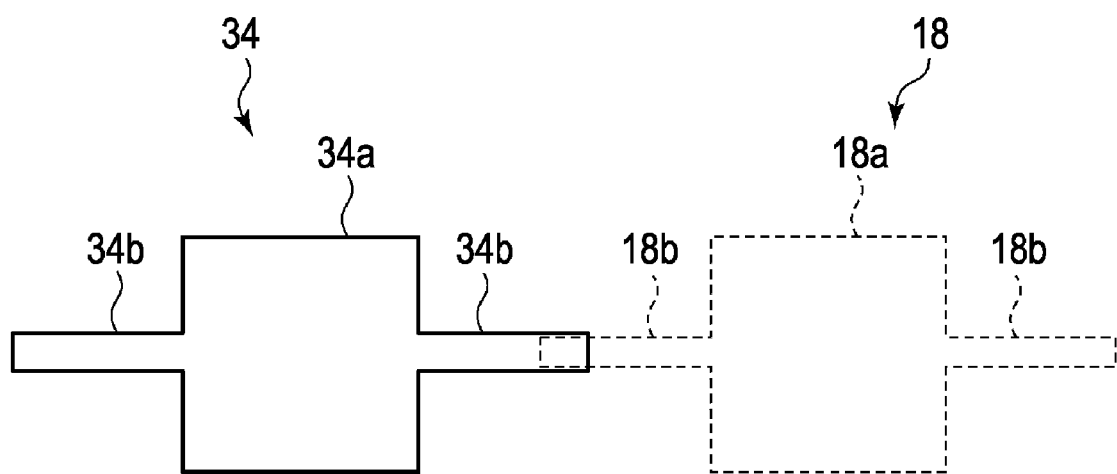
FIG. 20 is a plan view showing a basic unit of the wiring structure used in the evaluation of the semiconductor device according to the second embodiment.
Figure 21:
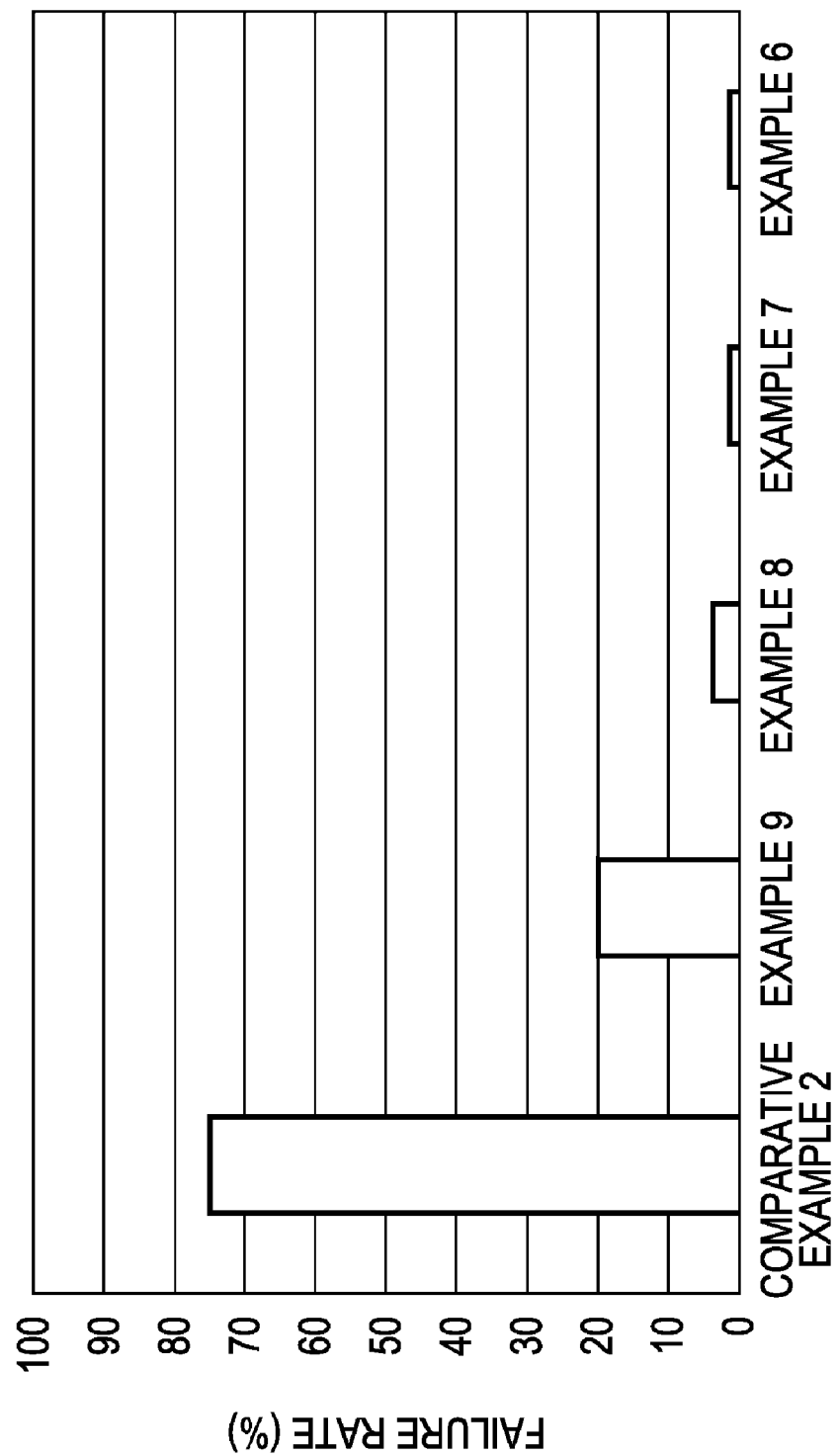
FIG. 21 is a graph showing an evaluation result of semiconductor devices according to examples 6 to 9 in the second embodiment.

A semiconductor device according to a second embodiment and a method for manufacturing the semiconductor device are described using FIGS. 12 to 21. FIG. 12 is a plan view showing a structure of the semiconductor device according to the second embodiment. FIGS. 13 to 19 are process sectional views showing a method for manufacturing the semiconductor device according to the second embodiment. FIG. 20 is a plan view showing a basic unit of a wiring structure used in the evaluation of the semiconductor device according to the second embodiment. FIG. 21 is a graph showing an evaluation result of the semiconductor device according to the second embodiment. The components of FIGS. 5 and 6 similar to those of the semiconductor device in the example 1 in the first embodiment are assigned the same reference numerals and detailed explanations thereof are omitted or simplified.

The basic constitution of the semiconductor device according to the first embodiment is substantially similar to the semiconductor device according to the example 1 in the first embodiment, as shown in FIG. 12. In the second embodiment, a dummy via 40c is formed not in a wide wiring part 34a, but in a protruding wiring part 34b on the wide wiring part 34a side.

Hereinafter, in the second embodiment, a method for manufacturing a wiring structure is described as an example in which the wiring structure including a via 38 is formed. However, the wiring structure including dummy vias 40a, 40b, 40c, and 40d has a cross sectional structure similar to the wiring structure including the via 38 and is formed simultaneously with the wiring structure including the via 38 in the same way as the wiring structure including the via 38.

First, an interlayer insulating film 12 formed of a porous silica film 46 and an SiC film 48 sequentially stacked is formed on a semiconductor substrate (not shown). Subsequently, a first wiring 18 buried in the interlayer insulating film 12 is formed.

Next, an SiC film 50 having a thickness of, for example, 30 nm is formed on the interlayer insulating film 12 with the first wiring 18 buried therein by, for example, a plasma CVD method.

Next, an SiOC film 52 having a thickness of, for example, 150 nm is formed on the SiC film 50 by, for example, the plasma CVD method.

Figure 13A:
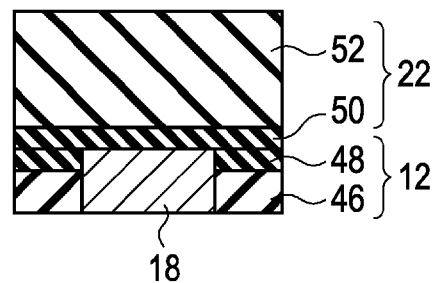
FIGS. 13A to 13C are cross-sectional views showing a method for manufacturing the semiconductor device according to the second embodiment.

Thus, an interlayer insulating film 22 formed of the SiC film 50 and the SiOC film 52 sequentially stacked is formed on the interlayer insulating film 12 (see, FIG. 13A).

Next, a porous silica film 54 having a thickness of, for example, 150 nm is formed on the interlayer insulating film 22.

Next, an SiC film 56 having a thickness of, for example, 30 nm is formed on the porous silica film 54 by, for example, the plasma CVD method.

Figure 13B:
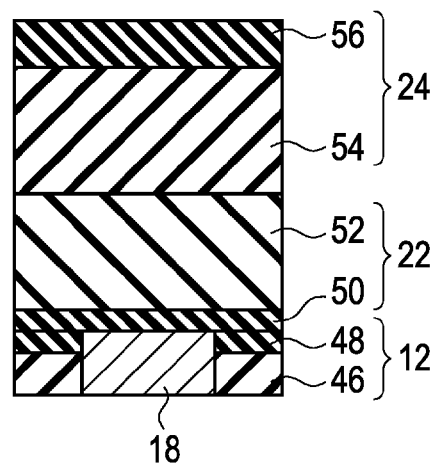

Thus, an interlayer insulating film 24 formed of the porous silica film 54 and the SiC film 56 sequentially stacked is formed on the interlayer insulating film 22 (see, FIG. 13B).

Next, a silicon oxide film 58 having a thickness of, for example, 120 nm is formed on the interlayer insulating film 24 by, for example, the plasma CVD method.

Next, a silicon nitride film 60 having a thickness of, for example, 30 nm is formed on the silicon oxide film 58 by, for example, the plasma CVD method.

Next, a polymer film 62 having a thickness of, for example, 50 nm is formed on the silicon nitride film 60 by, for example, the spin coat method.

Next, a silicon oxide film 64 having a thickness of, for example, 30 nm is formed on the polymer film 62 by, for example, the plasma CVD method.

Next, an organic antireflection film 66 and an ArF resist film 68 are formed on the silicon oxide film 64 by, for example, the spin coat method.

Figure 13C:
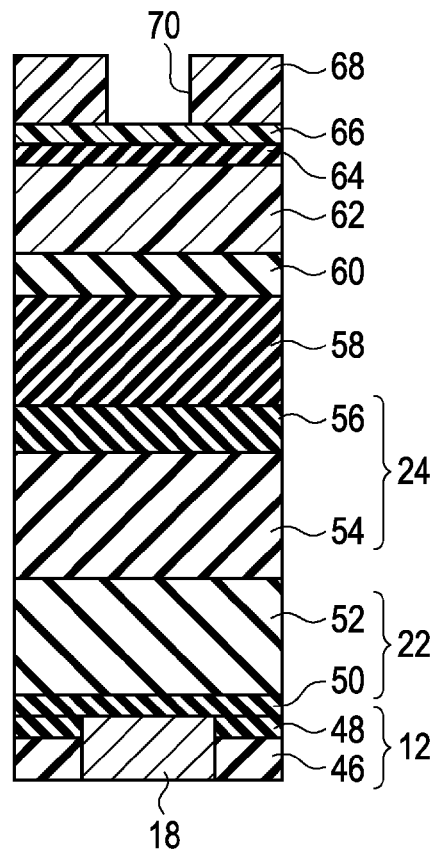

Next, the ArF resist film 68 is patterned to form an opening 70, through which the formation region of the via 38 is exposed, by means of photolithography (see, FIG. 13C).

Figure 14A:
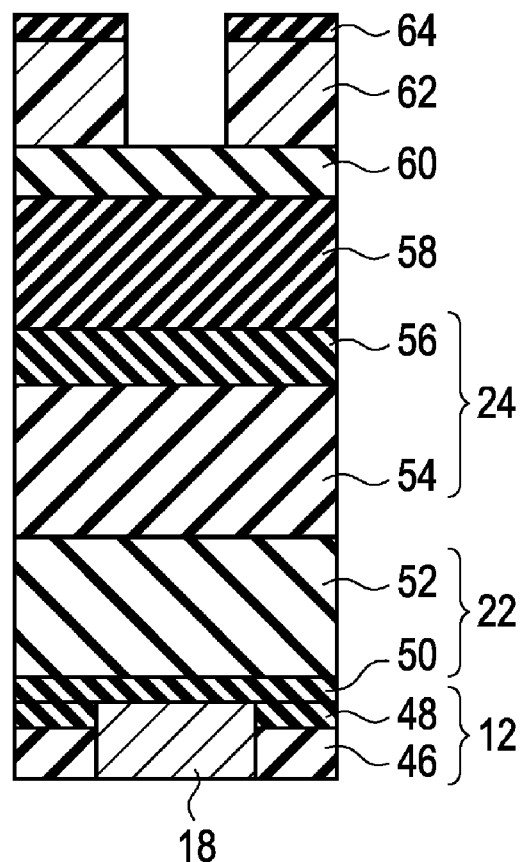
FIGS. 14A and 14B are cross-sectional views showing the method for manufacturing the semiconductor device according to the second embodiment.

Next, the organic antireflection film 66 and the silicon oxide film 64 are etched using the ArF resist film 68 as a mask, and the polymer film 62 is etched using the silicon oxide film 64 as a mask, and the pattern of the ArF resist film 68 is transferred to the polymer film 62 (see, FIG. 14A). The organic antireflection film 66 and the silicon oxide film 64 can be etched by $CF_4$ plasma, and the polymer film 62 can be etched by $H_2/NH_3$ or $H_2/N_2$ plasma. When the polymer film 62 is etched, the ArF resist film 68 and the organic antireflection film 66 are etched to be removed at the same time.

Next, the silicon nitride film 60, the silicon oxide film 58, the SiC film 56, the porous silica film 54, and the SiOC film 52 are sequentially etched using the polymer film 62 as a mask to open a via hole 26 until reaching the SiOC film 52. The silicon nitride film 60 can be etched by $CH_2F_2$ plasma, the silicon oxide film 58 can be etched by $C_4F_6$ plasma, the SiC film 56 can be etched by $CF_4$ plasma, the porous silica film 54 can be etched by $CF_4$ plasma, and the SiOC film 52 can be etched by $C_4F_6$ plasma. The SiC film 50 protects the first wiring 18 from the etching of the SiOC film 52.

Figure 14B:
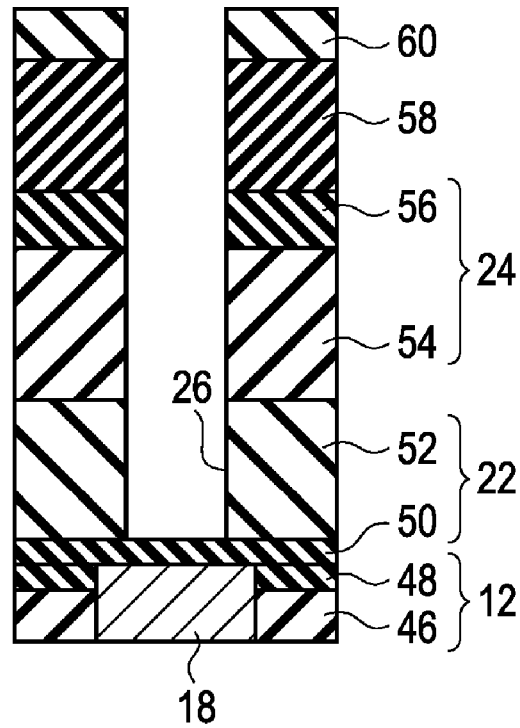

Next, the polymer film 62 is removed by ashing using oxygen plasma, for example (see, FIG. 14B).

Next, a polymer film 72 having a thickness of, for example, 0.3 µm is formed on the entire surface by, for example, the spin coat method. The application condition and the film thickness of the polymer film 72 is suitably controlled so that the polymer film 72 is buried in the via hole 26, and, at the same time, so that the region on the via hole 26 is flat.

Next, a silicon oxide film 74 having a thickness of, for example, 20 nm is formed on the polymer film 72 by, for example, the plasma CVD method.

Next, an organic antireflection film 76 and an ArF resist film 78 are formed on the silicon oxide film 74 by, for example, the spin coat method.

Figure 15A:
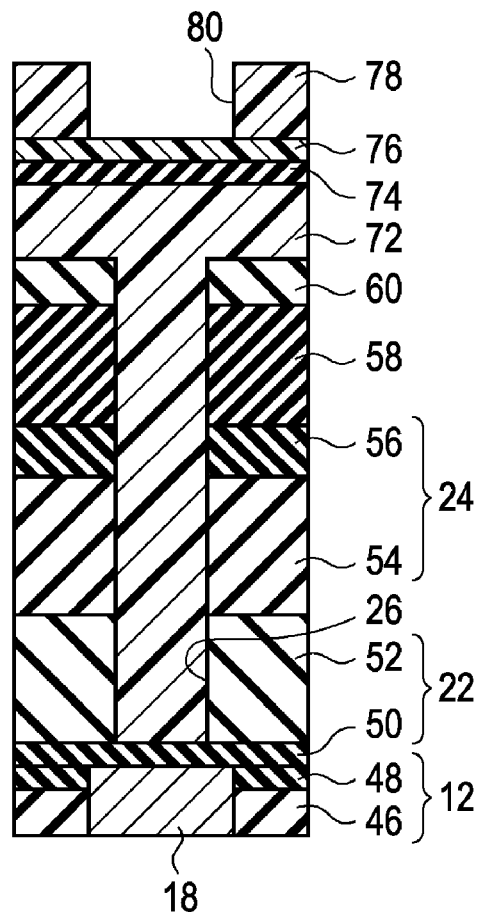
FIGS. 15A and 15B are cross-sectional views showing the method for manufacturing the semiconductor device according to the second embodiment.

Next, the ArF resist film 78 is patterned to form an opening 80, through which the formation region of the wiring groove 30 is exposed is formed, by means of photolithography (see, FIG. 15A).

Next, the organic antireflection film 76 and the silicon oxide film 74 are etched using the ArF resist film 78 as a mask, the polymer film 72 is etched using the silicon oxide film 74 as a mask, and the pattern of the ArF resist film 78 is transferred to the polymer film 72. The organic antireflection film 76 and the silicon oxide film 74 can be etched by $CF_4$ plasma, the polymer film 72 can be etched by $H_2/NH_3$ or $H_2/N_2$ plasma. When the polymer film 72 is etched, the ArF resist film 78 and the organic antireflection film 76 are etched to be removed at the same time.

Figure 15B:
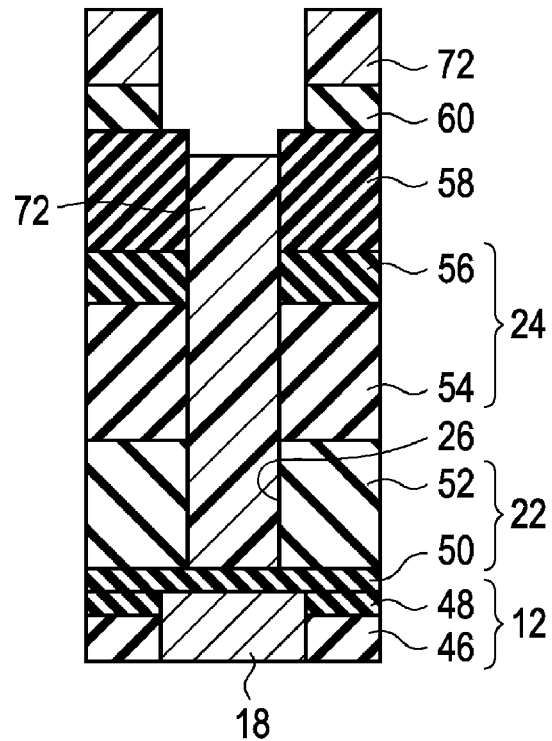

Next, the silicon nitride film 60 is etched using the polymer film 72 as a mask, and the pattern of the polymer film 72 is transferred to the silicon nitride film 60 (see, FIG. 15B). At this time, the silicon oxide film 74 on the polymer film 72 is removed.

Figure 16A:
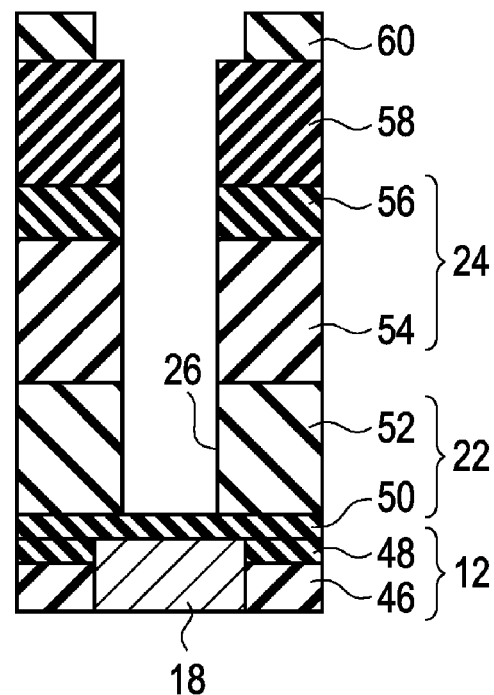
FIGS. 16A and 16B are cross-sectional views showing the method for manufacturing the semiconductor device according to the second embodiment.

Next, the polymer-film 72 is removed by ashing using oxygen plasma, for example (see, FIG. 16A).

Figure 16B:
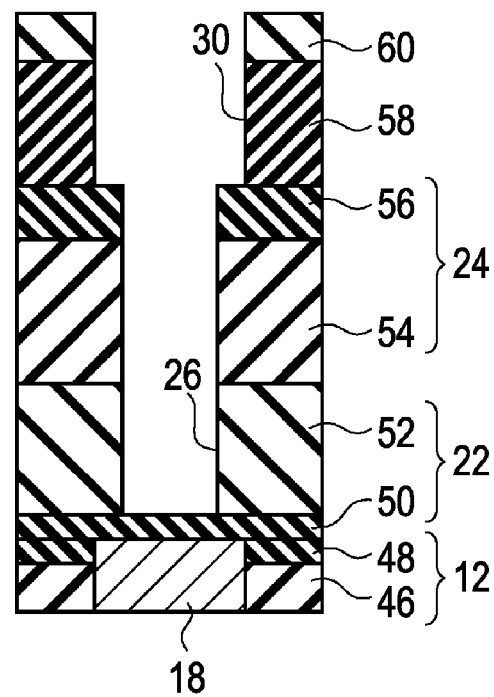

Next, the silicon oxide film 58 is etched using the silicon nitride film 60 as a mask to open the wiring groove 30 until reaching the silicon oxide film 58 (see, FIG. 16B). The silicon oxide film 58 can be etched by $CF_4F_6$ plasma.

Next, the SiC film 56 is etched using the silicon nitride film 60 as a mask to open the wiring groove 30 until reaching the SiC film 56. At this time, the SiC film 50 at the bottom of the via hole 26 is also etched to be removed (see, FIG. 17A). The SiC film 56 can be etched by $CF_4$ plasma.

Figure 17A:
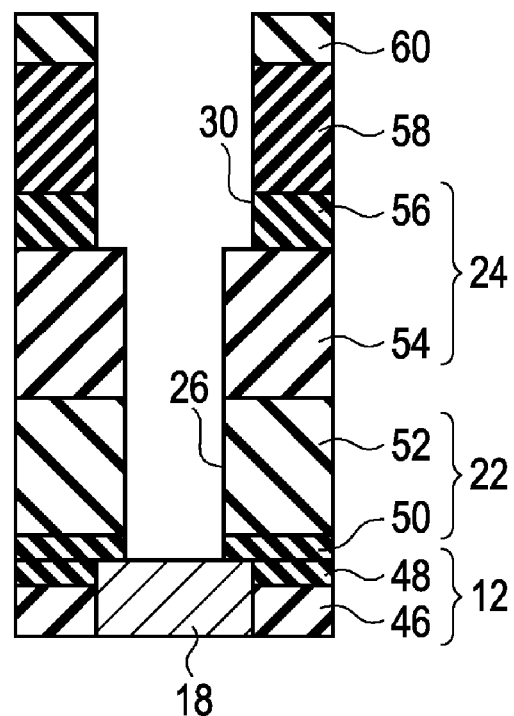
FIGS. 17A and 17B are cross-sectional views showing the method for manufacturing the semiconductor device according to the second embodiment.
Figure 17B:
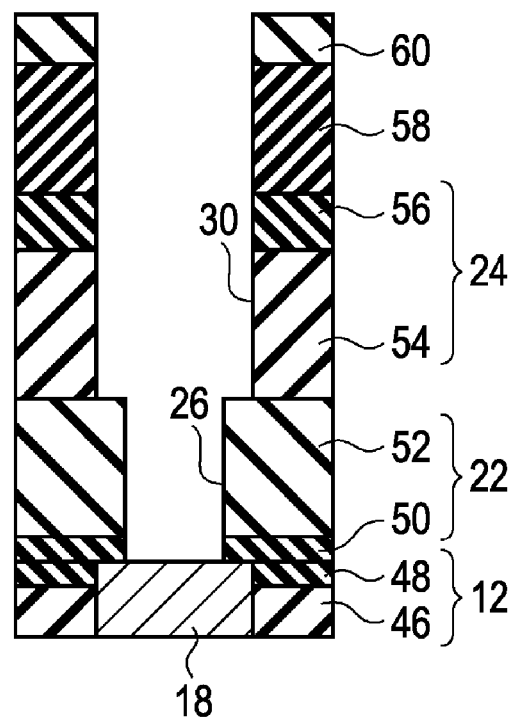

Next, the porous silica film 54 is etched using the silicon nitride film 60 as a mask to open the wiring groove 30 until reaching the porous silica film 54 (see, FIG. 17B). The porous silica film 54 can be etched by $CF_4$ plasma.

Thus, the wiring groove 30 connected to the via hole 26 is formed in the interlayer insulating film 24.

Figure 18A:
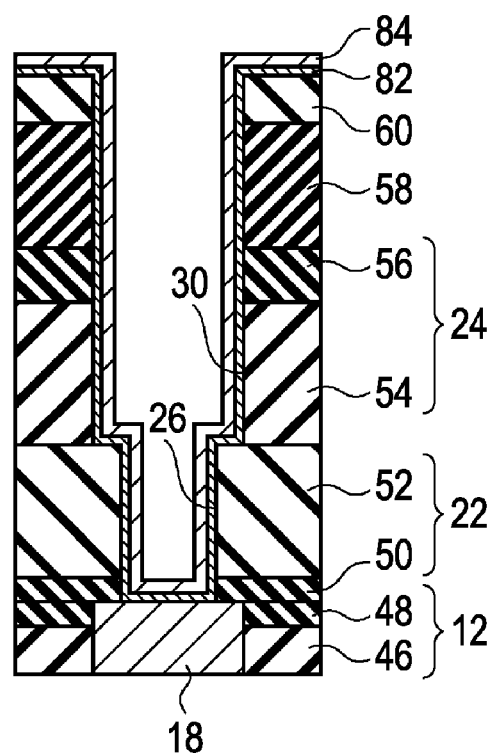
FIGS. 18A and 18B are cross-sectional views showing the method for manufacturing the semiconductor device according to the second embodiment.

Next, a barrier metal film 82 formed of tantalum, tungsten, titanium, tantalum nitride, tungsten nitride, and titanium nitride, or formed of a stacked film of them and a copper film 84 are formed on the entire surface including the inside of the via hole 26 and the inside of the wiring groove 30 by a sputtering method (see, FIG. 18A).

Figure 18B:
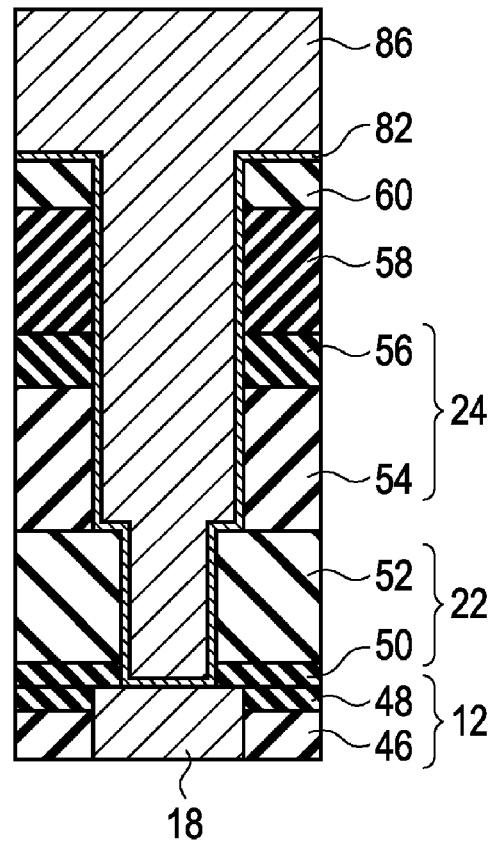

Next, copper plating is applied using the copper film 84 as a seed layer, and the via hole 26 and the wiring groove 30 are filled with the copper film 86 (FIG. 18B).

Next, the Cu film 86 and the barrier metal film 82 are polished by a CMP method until the silicon nitride film 60 is exposed (see, FIG. 19A).

Subsequently, the Cu film 86 and the barrier metal film 82 are polished together with the silicon nitride film 60 and the silicon oxide film 58 until the SiC film 56 is exposed. Thus, the second wiring 34 formed of the barrier metal film 82 and the Cu film 86 and connected to the first wiring 18 is formed in the via hole 26 and the wiring groove 30 (FIG. 19B). The second wiring 34 is formed so as to integrally have the via 38 buried in the via hole 26.

Thus, the wiring structure including the via 38 is formed by a dual damascene method. The wiring structure including the dummy vias 40a, 40b, 40c, and 40d is formed simultaneously with the wiring structure including the via 38 in the same way as the wiring structure including the via 38.

(Evaluation Result)

Next, the evaluation result of the semiconductor device according to the second embodiment is described using FIGS. 20 and 21.

A stress migration test was conducted with respect to the semiconductor device according to the second embodiment shown in FIG. 12 in which the wiring structure including the via 38 and the dummy vias is formed by the above manner, and the stress migration resistance was evaluated.

The wiring structure subjected to the stress migration test is as follows.

In the constitution shown in FIG. 12, the width of the wide wiring part 34a of the second wiring 34 was set to be 3 µm, and the width of the protruding wiring part 34b was set to be 0.07 µm. The length of the protruding wiring part 34b was set to be 0.3 µm. The interval between the dummy via 40a and the via 38 and the interval between the dummy via 40b and the via 38 are set to be 0.07 µm. In the first wiring 18, the width of the wide wiring part 18a, the width of the protruding wiring part 18b, and the length of the protruding wiring part 18b are set to be the same value as the second wiring 34.

As shown in FIG. 20, the first and second wiring 18 and 34 respectively have on their ends protruding wiring parts 18b and 34b. The basic unit in which these components are connected to each other as shown in FIG. 12 is repeated 10000 times to connect the basic units in series.

The stress migration test was conducted with respect to examples 6 to 9 and a comparative example 2 in which the wiring structure having the repeated basic units connected to each other and having a different number of dummy vias.

The example 6 shows a case in which the four dummy vias 40a, 40b, 40c, and 40d are disposed.

The example 7 shows a case in which the three dummy vias 40a, 40b, and 40d are disposed.

The example 8 shows a case in which the two dummy vias 40a and 40b are disposed.

The example 9 shows a case in which the one dummy via 40d is disposed.

The comparative example 2 shows a case in which none of the four dummy vias 40a, 40b, 40c, and 40d are disposed.

In the stress migration test, the number of samples is 152, the heat treatment is applied to the produced wiring structure at 200° C. for 500 hours, and the wiring structure with the resistance value after the heat treatment of 50% higher than the initial value before the heat treatment has been counted as a failure.

In FIG. 21, the result of the stress migration test is shown with bar graphs. As seen in the result shown in FIG. 21, the failure rate is reduced by increasing the number of the disposed dummy vias. In particular, in the examples 6 to 8 in which two or more dummy vias are disposed, the failure rate is remarkably reduced in comparison with the comparative example 2 without disposing the dummy via.

The result of the stress migration test shown in FIG. 21 shows that, when two or more dummy vias are disposed, the stress migration resistance of the via 38 is especially effectively improved, whereby the failure rate can be reliably reduced.

The stress from the wide wiring part 34a acting on the via 38 more significantly affects the stress migration resistance of the via 38 with decreasing the length of the protruding wiring part 34b with the integrally formed via 38. The present inventor has experimentally confirmed that when the length of the protruding wiring part 34b with the integrally formed via 38 is not more than 5 µm, the stress from the wide wiring part 34a acting on the via 38 affects the stress migration resistance of the via 38. Thus, when the length of the protruding wiring part 34b is not more than 5 µm, the dummy vias 40a, 40b, 40c, and 40d are disposed adjacent to the via 38, whereby the stress migration resistance can be particularly improved.

In the present examples, the two dummy vias 40c and 40d are respectively connected to the protruding wiring parts 34a and 18a and have the same potential as the via 38 and the wirings 18 and 34. According to this constitution, the wiring delay can be kept to a minimum while improving the stress migration resistance.

Other Embodiments

The above embodiments are not limited to the above description and can be variously modified.

For instance, in the above embodiments, although the first and second wirings 18 and 34 have the protruding wiring parts 18b and 34b, at least one of the first and second wirings 18 and 34 may have a protruding wiring part, and another one may be a wiring with a constant width without a protruding wiring part.

Figure 22A:
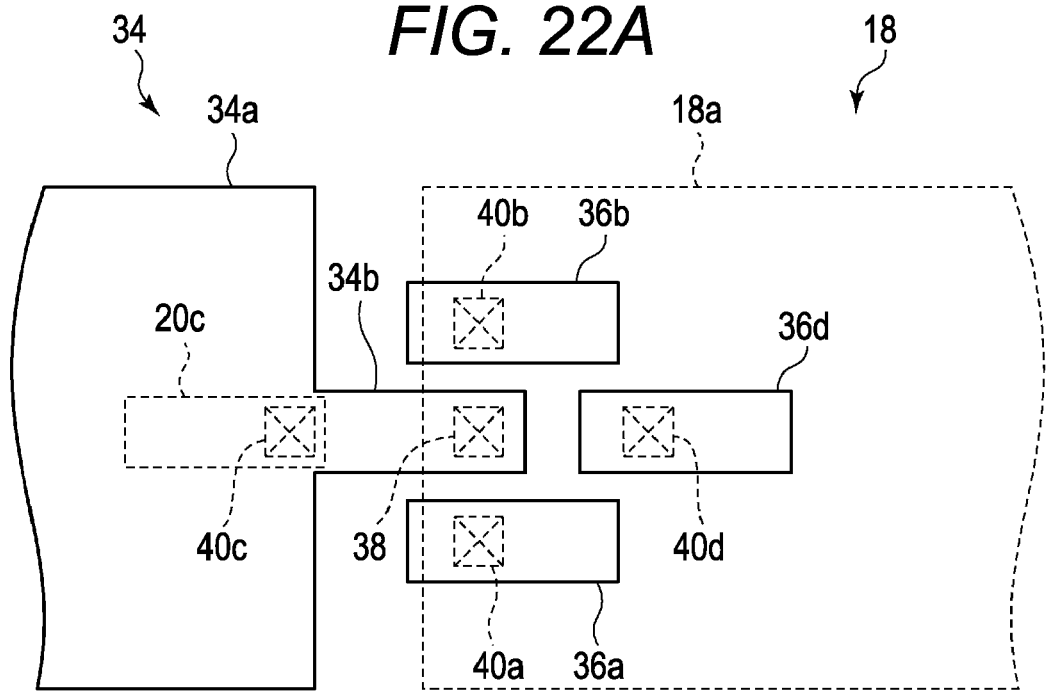
FIGS. 22A and 22B are plan views showing a structure of a semiconductor device according to another embodiment.

For example, FIG. 22A is a plan view showing a case in which a lower layer first wiring 18 does not have a protruding wiring part 18b and is constituted of only a wide wiring part 18a. In this case, as illustrated in FIG. 22A, a via 38 formed in a protruding wiring part 34b of a second wiring 34 is connected to the wide wiring part 18a of the first wiring 18. Additionally, dummy vias 40a, 40b, and 40d are also connected to the wide wiring part 18a of the first wiring 18.

Figure 22B:
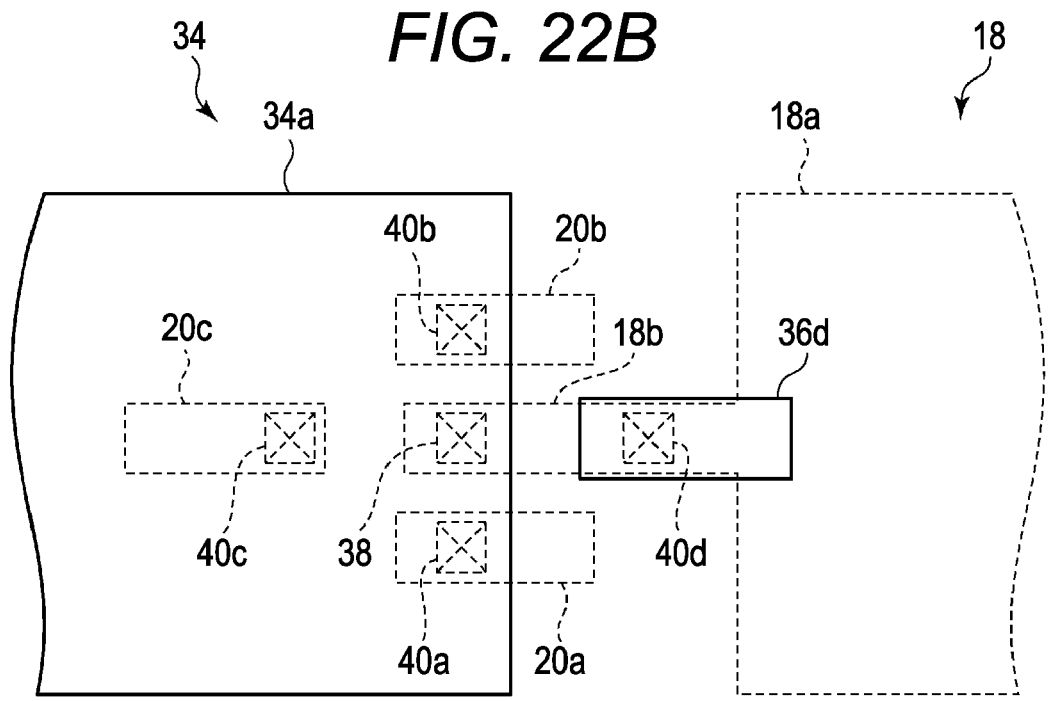

Meanwhile, FIG. 22B is a plan view showing a case in which an upper layer second wiring 34 does not have a protruding wiring part 34b and is constituted of only a wide wiring part 34a. In this case, as illustrated in FIG. 22B, a via 38 of the second wiring 34 connected to the protruding wiring part 18b of a first wiring 18 is integrally formed in the wide wiring part 34a. The dummy vias 40a, 40b, and 40c are also integrally formed in the wide wiring part 34a.

As shown in the above, at least one of the first and second wirings 18 and 34 may have a protruding wiring part.

Further, in the above embodiments, although all or a part of the dummy vias 40a, 40b, 40c, and 40d are disposed adjacent to the via 38, the combination of the dummy vias which are disposed is not limited to the above combination, and can be suitably selected in accordance with the layout of the actual wiring and the like.

Further, in the above embodiments, although the interlayer insulating film is constituted using the SiC film, the SiOC film, and the porous silica film, it can be constituted using any insulating films such as an organic insulating film and, for example, SiON, SiN, $SiO_2$, or the like instead of SiC. The interlayer insulating film does not necessarily have a stacked structure of the SiOC film 52 and the porous silica film 54, and the above embodiments can be applied to a process of forming a wiring layer and a via hole in an interlayer film formed of a single porous film, for example.

Further, in the above embodiments, when the wide wiring parts 18a and 34a extend in the same direction, the protruding wiring parts 18b and 34b extend in the same direction as the extending direction of the wide wiring parts 18a and 34a; however, the extending direction of the protruding wiring parts 18b and 34b is not limited to this. For example, when the wide wiring parts 18a and 34a extend in the same direction, the protruding wiring parts 18b and 34b may extend in a direction different from the extending direction of the wide wiring parts 18a and 34a.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
a first wiring;
a via connected to the first wiring;
a second wiring connected to the via; and
a dummy via disposed adjacent to the via at a distance of 100 nm or less and formed on the same layer as the via.

2. The semiconductor device as claimed in claim 1, wherein a plurality of the dummy vias are disposed.

3. The semiconductor device as claimed in claim 1, wherein the first wiring has a wide wiring part and a protruding wiring part having a smaller width than the wide wiring part and protruding from the wide wiring part, and the via is connected to the protruding wiring part.

4. The semiconductor device as claimed in claim 1, wherein the second wiring has a wide wiring part and a protruding wiring part having a smaller width than the wide wiring part, and protruding from the wide wiring part, and the via is connected to the protruding wiring part.

5. The semiconductor device as claimed in claim 1, further comprising a first dummy wiring formed in the same layer as the first wiring, wherein the dummy via is connected to the first dummy wiring.

6. The semiconductor device as claimed in claim 5, further comprising a second dummy wiring formed in the same layer as the second wiring, wherein the dummy via is connected to the second dummy wiring.

7. The semiconductor device as claimed in claim 5, wherein the dummy via is connected to the second wiring.

8. The semiconductor device as claimed in claim 1, wherein the dummy via is connected to the first wiring.

9. The semiconductor device as claimed in claim 8, further comprising a first dummy wiring formed in the same layer as the second wiring, wherein the dummy via is connected to the first dummy wiring.

10. The semiconductor device as claimed in claim 1, wherein the second wiring includes a wiring material having copper.

11. The semiconductor device as claimed in claim 1, wherein a distance between the via and the dummy via is 50 nm or more.

12. A semiconductor device comprising:
a first wiring having a first wide wiring part and a first protruding wiring part having a smaller width than the first wide wiring part and protruding from the first wide wiring part;
a second wiring formed on a layer different from a layer of the first wiring and having a second wide wiring part and a second protruding wiring part having a smaller width than the second wide wiring part and protruding from the second wide wiring part;
a via electrically connecting the first protruding wiring part to the second protruding wiring part;
a first dummy via formed on the same layer as the via and electrically connected to the first protruding wiring part; and
a second dummy via formed on the same layer as the via and electrically connected to the second protruding wiring part.

13. The semiconductor device as claimed in claim 12, further comprising a third dummy via formed in the same layer as the via and being in an electrically floating state.

14. The semiconductor device as claimed in claim 12, wherein the first and second wide wiring parts extend in a first direction, and the first and second protruding wiring parts extend in a second direction different from the first direction.

15. The semiconductor device as claimed in claim 12, wherein a distance between the first dummy via, the second dummy via, or the third dummy via and the via is not less than 50 nm and not more than 100 nm.

\* \* \* \* \*